(12) United States Patent
Nagpal et al.

(10) Patent No.: US 9,804,204 B2
(45) Date of Patent: Oct. 31, 2017

(54) METHOD OF IMPLEMENTATION OF PEAK HOLD IN A PHASING VOLTMETER

(75) Inventors: Anil Nagpal, Andhra Pradesh (IN); Ataur Rahman, Andhra Pradesh (IN)

(73) Assignee: Honeywell International Inc., Morristown, NJ (US)

( * ) Notice: Subject to any disclaimer, the term of this patent is extended or adjusted under 35 U.S.C. 154(b) by 1028 days.

(21) Appl. No.: 13/238,418

(22) Filed: Sep. 21, 2011

(65) Prior Publication Data

US 2013/0069629 A1    Mar. 21, 2013

(51) Int. Cl.
| | |
|---|---|
| *G01R 19/04* | (2006.01) |
| *G01R 19/30* | (2006.01) |
| *G01R 19/02* | (2006.01) |
| *G01R 25/00* | (2006.01) |
| G01R 1/067 | (2006.01) |
| G01R 1/07 | (2006.01) |

(52) U.S. Cl.
CPC ............. *G01R 19/04* (2013.01); *G01R 19/02* (2013.01); *G01R 25/005* (2013.01); *G01R 1/06777* (2013.01); *G01R 1/06788* (2013.01); *G01R 1/07* (2013.01)

(58) Field of Classification Search
CPC ...... G01R 1/0677; G01R 15/14; G01R 19/02; G01R 19/04; G01R 19/06; H03K 5/1532
USPC .............................. 324/103 P, 119, 120, 508
See application file for complete search history.

(56) References Cited

U.S. PATENT DOCUMENTS

| | | | | |
|---|---|---|---|---|
| 3,193,765 | A  * | 7/1965 | Bevins | 324/149 |
| 5,117,180 | A  * | 5/1992 | Swerlein | 324/132 |
| 5,136,234 | A  * | 8/1992 | Shaw | 324/72 |
| 5,315,168 | A | 5/1994 | Norton, Jr. | |
| 5,453,749 | A  * | 9/1995 | Morita | G08B 29/26 341/118 |
| 5,471,134 | A  * | 11/1995 | Oudille et al. | 324/103 P |
| 5,581,016 | A  * | 12/1996 | Gonzalez et al. | 73/35.06 |
| 5,714,679 | A  * | 2/1998 | Nichols | F02P 17/12 324/399 |
| 6,380,726 | B1 * | 4/2002 | Szabo | 324/115 |
| 6,392,402 | B1 * | 5/2002 | Swift | 324/132 |
| 6,429,696 | B1 | 8/2002 | Kao et al. | |
| 6,459,252 | B1 * | 10/2002 | Bierer | 324/72.5 |
| 6,498,517 | B2 | 12/2002 | Miyazaki | |
| 7,016,796 | B2 * | 3/2006 | Damle et al. | 702/66 |
| 7,642,788 | B2 * | 1/2010 | Gallavan | 324/522 |
| 7,746,051 | B1 * | 6/2010 | Buchanan et al. | 324/72.5 |

(Continued)

*Primary Examiner* — Giovanni Astacio-Oquendo
(74) *Attorney, Agent, or Firm* — Wood, Phillips, Katz, Clark & Mortimer

(57) ABSTRACT

A high voltage phasing voltmeter comprises first and second probes. Each probe comprises an electrode for contacting a high voltage electrical conductor. The electrodes are connected in series with a resistor. A meter comprises a housing enclosing an electrical circuit for measuring true rms voltage. The electrical circuit comprises an input circuit for connection to the first and second probes and developing a scaled voltage representing measured voltage across the electrodes. A converter circuit converts the scaled voltage to a DC signal representing true rms value of the measured voltage. A peak hold circuit is connected to the converter circuit to hold a peak value of the true rms value. A display is connected to the peak hold circuit for displaying the peak value of the true rms value.

20 Claims, 4 Drawing Sheets

(56) References Cited

U.S. PATENT DOCUMENTS

| 9,329,215 | B2* | 5/2016 | Endo | G01R 27/02 |
|---|---|---|---|---|
| 2002/0135353 | A1* | 9/2002 | Bierer | 324/103 P |
| 2012/0074928 | A1* | 3/2012 | Cs et al. | 324/123 R |

* cited by examiner

*Fig.* 2

METHOD OF IMPLEMENTATION OF PEAK HOLD IN A PHASING VOLTMETER

CROSS-REFERENCE TO RELATED APPLICATIONS

Not Applicable.

FEDERALLY SPONSORED RESEARCH OR DEVELOPMENT

Not Applicable.

MICROFICHE/COPYRIGHT REFERENCE

Not Applicable.

FIELD

The disclosure relates generally to high voltage phasing voltmeters and more particularly, to implementation of a peak hold function.

BACKGROUND

Electrical power distribution systems often include overhead electrical power distribution lines mounted upon poles by a wide variety of mounting structure. Other distribution systems include underground distribution lines in which protected cables run under the ground surface. It is often necessary to take phase-to-phase voltage measurements across transmission lines while testing for induced or live power lines or equipment.

Known high voltage safety line detectors, meters and testers comprise high resistance probes connected in series with a calibrated panel meter to read the voltage across the phase-to-phase or phase-to-ground terminals. They are designed for use as safety tools by high voltage line maintenance workers to verify the status of the line or equipment as nominal, induced or de-energized. Known devices for providing such measurements include contact type and non-contact type. With contact type a reference probe or transmitter and a meter probe or receiver are connected in series with a cable as the loop is closed with load terminals.

Under normal conditions, a meter reading is valid only while the probes are electrically connected to load terminals. Once the probes are removed from the load terminals, the meter does not show the measured value. If long extension poles are being used, then the meter is spaced a distance from the lineman. This can make it difficult for the lineman to read the meter while taking measurements.

Existing meters have functionality to store the peak rms value of an AC voltage. However, these systems use a microcontroller approach which requires software development time, and additional hardware costs for the microcontrollers and analog to digital converters and the like. Moreover, these devices do not show true rms value of the voltage on the line. Instead, such devices are generally providing a calculated value based on peak voltage which does not correspond to the true rms value.

The present disclosure is directed to improvements in high voltage phasing voltmeters.

SUMMARY

The disclosure relates to a high voltage phasing voltmeter that displays the true rms voltage of the line on a display even after removing the probes from the load terminals.

In one aspect there is disclosed a high voltage phasing voltmeter comprising first and second probes. Each probe comprises an electrode for contacting a high voltage electrical conductor. The electrodes are connected in series with a resistor. A meter comprises a housing enclosing an electrical circuit for measuring true rms voltage. The electrical circuit comprises an input circuit for connection to the first and second probes and developing a scaled voltage representing measured voltage across the electrodes. A converter circuit converts the scaled voltage to a DC signal representing true rms value of the measured voltage. A peak hold circuit is connected to the converter circuit to hold a peak value of the true rms value. A display is connected to the peak hold circuit for displaying the peak value of the true rms value.

The input circuit may comprise a filter circuit. The converter circuit may convert an AC input signal to a DC output signal. The peak hold circuit may comprise a rectifier circuit having an input connected to the converter circuit and having an output connected to a capacitor to hold the peak value of the true rms value. The capacitor may be connected by a buffer to the display. The rectifier circuit may comprise an operational amplifier connected to a transistor switch. The capacitor may have high isolation resistance. The housing may be integral with the hand held shield for one of the probes and further comprises a cable electrically connected between the electrical circuit and the other of the probes. The electrical circuit may comprise a battery operated circuit.

There is disclosed in accordance with another aspect a portable high voltage phasing voltmeter comprising a first probe and a second probe each comprising an elongate insulated shield. An electrode extends from a distal end of the shield for contacting a high voltage electrical conductor. A resistor in the shield is connected in a series with the electrode. A meter comprises a housing enclosing an electrical circuit for measuring true rms voltage. The electrical circuit comprises an input circuit for connection to the first and second probe resistors and developing a scaled voltage representing measured voltage across the electrodes. A converter circuit converts the scaled voltage to a DC signal representing true rms value of the measured voltage. A peak hold circuit is connected to the converter circuit to hold a peak value of the true rms value. A display is connected to the peak hold circuit for displaying the peak value of the true rms value.

Other features and advantages will be apparent from a review of the entire specification, including the appended claims and drawings.

DETAILED DESCRIPTION

Figure 1:
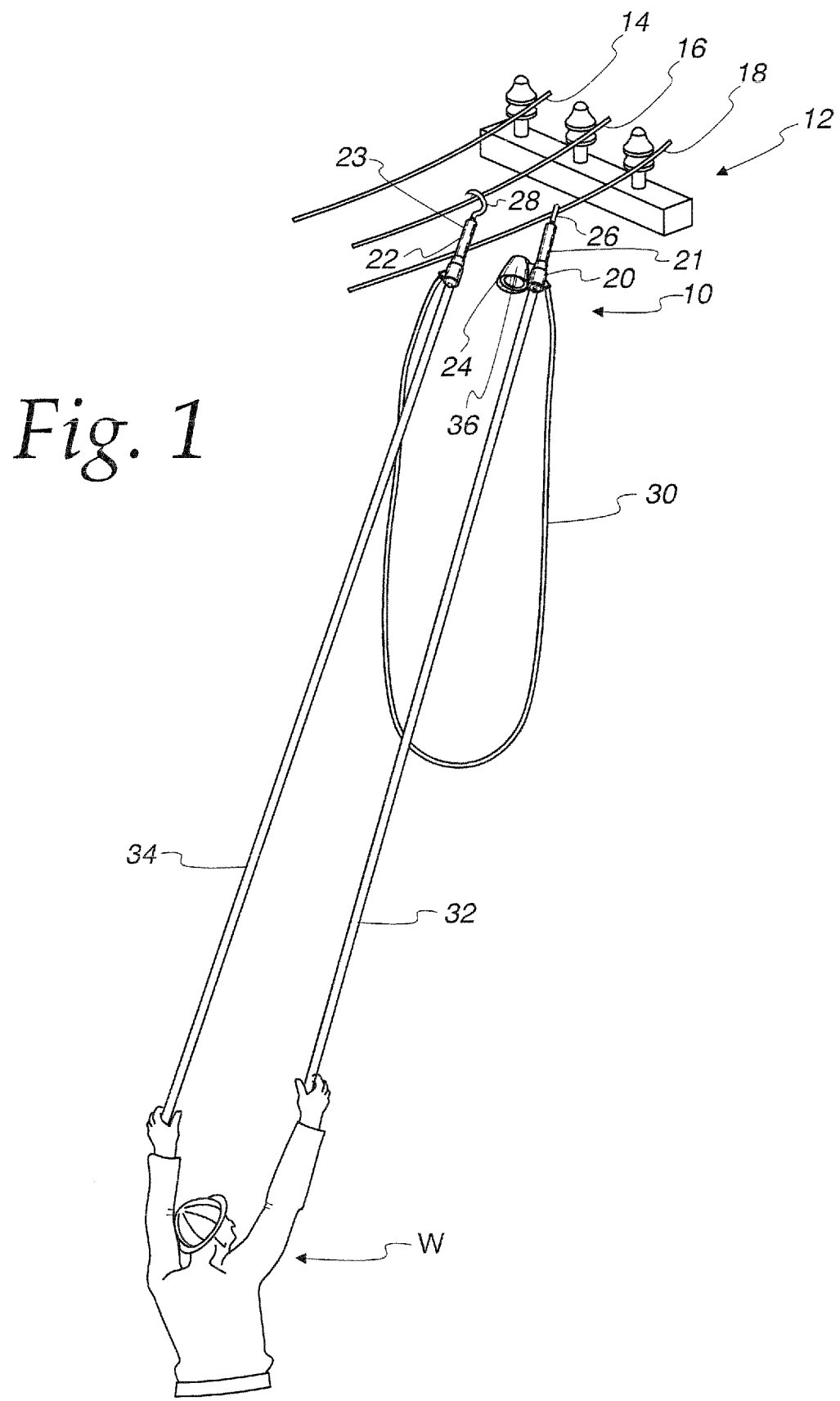
FIG. 1 is a perspective view of use of a high voltage phasing voltmeter as described herein.

Referring initially to FIG. 1, a portable high voltage phasing voltmeter 10 is shown for measuring phase-to-phase voltage or voltage to ground between lines in a high voltage transmission line system 12. The transmission line system 12 includes three conductors 14, 16 and 18 carrying high voltage power of alternating current with each line being 120 degrees out of phase with the other lines, as is conventional. The voltmeter 10 may be used by a lineman or maintenance worker W for measuring voltage such as between the electrical conductors 16 and 18 as illustrated in FIG. 1. The voltmeter 10 may also be used to measure other voltages, such as phase to neutral, as is known.

Figure 2:
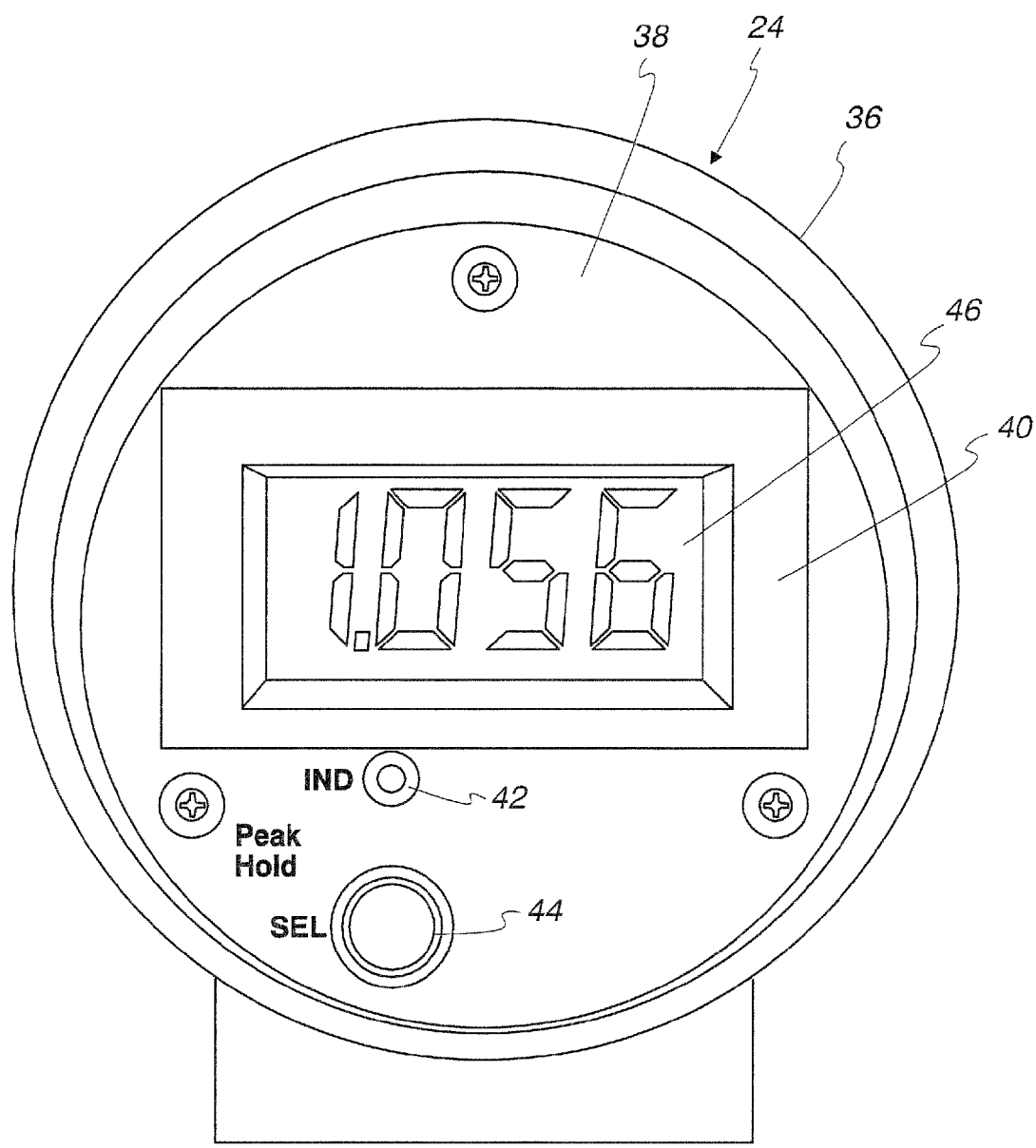
FIG. 2 is a front view of a meter housing of the high voltage phasing voltmeter.

The voltmeter 10 comprises a first probe 20, also known as a meter probe, and a second probe 22, also known as a reference probe. A meter 24, see also FIG. 2, is integral with the first probe 20. The first probe 20 includes an elongate insulated shield 21 and a first electrode 26 extending from a distal end thereof. The second probe 22 includes an elongate insulated shield 23 a second electrode 28 extending from a distal end thereof. A coaxial cable 30 is connected between the first probe 20 and the second probe 22. A first extension pole 32 is connected to the first probe insulated shield 21. A second extension pole 34 is connected to the second probe insulated shield 23. The extension poles 32 and 34 are of a select length to enable the maintenance worker W to extend the probes 20 and 22 to the transmission line system 12 so that the electrodes 26 and 28 contact select ones of the transmission line conductors 14, 16 and 18. The probes 20 and 22 may be of any conventional design.

Referring also to FIG. 2, the meter 24 comprises a housing 36 integrally formed with the first probe insulated shield 21, see FIG. 1. The housing 36 is frustoconical in shape including a bezel 38 supporting a digital panel meter 40. The bezel 38 also supports a peak and hold indicator 42 and a peak and hold selector switch 44. The digital panel meter 40 includes a digital display 46. Alternatively, an analog display could be used, as preferred.

As shown in FIG. 1, the lineman W can grip the extension poles 32 and 34 to contact the lines 16 and 18 with the respective electrodes 28 and 26. The meter display 46 is visible to enable the lineman W to read the measured voltage across the terminals. Particularly, as described herein, the meter 24 includes circuitry to enable the meter 24 to retain the measured value even after the probes 20 and 22 are removed from the line system 12 so that the measured voltage could be read from a closer distance to the lineman W.

Figure 3:
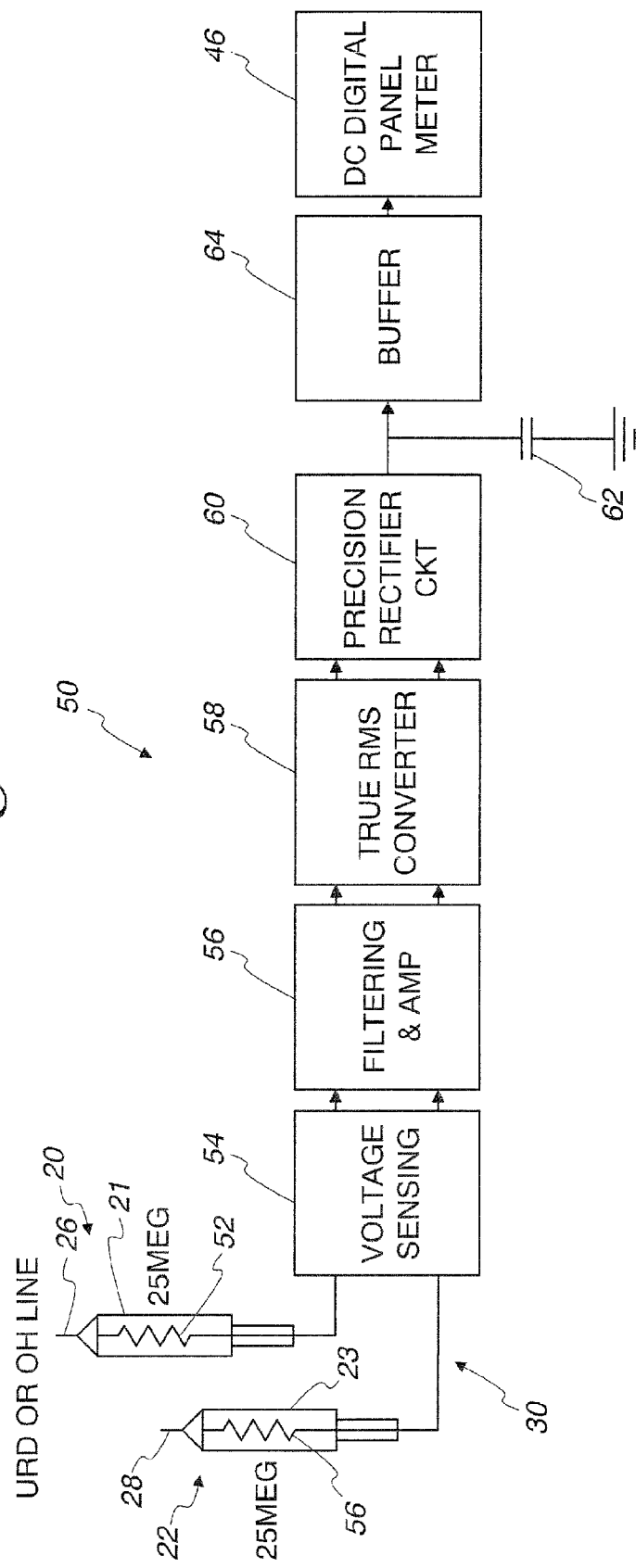
FIG. 3 is a block diagram of the high voltage phasing volt meter.

Referring to FIG. 3, the meter 24 comprises an electrical circuit 50 illustrated in block diagram form. The electrical circuit 50 is present on a circuit board (not shown) internal to the housing 36.

The cable 30 comprises a conventional coaxial cable. The cable is used for connecting the second probe 22 to the electrical circuit 50 in a conventional manner. This is illustrated generally in FIG. 3. Connections from the first probe 20 to the electrical circuit 50 are internal to the meter housing 36, as will be apparent.

The first probe 20 includes a high voltage resistor 52 in the shield 21 electrically connected between the first electrode 26 and a voltage sensing circuit 54. The second probe 22 includes a high voltage resistor 56 in the shield 23 electrically connected between the second electrode 28 and the voltage sensing circuit 54. The high voltage resistors 52 and 56 are illustrated to be 25 Megohm resistors. However, different resistance values could be used, as will be apparent.

As is conventional, the measured high voltage in the line system 12 is scaled down using the high resistance probes 20 and 22. The voltage sensing circuit 54 takes samples of the measured voltage between the electrodes 26 and 28. The scaled down voltage is filtered for high frequency and low frequency noise at a filtering and amplifier circuit 56 and fed to a true rms converter 58. The circuits 54 and 56 together define an input circuit. The true rms converter develops a DC output voltage fed to a precision rectifier circuit 60 which is connected in a loop with a peak hold element in the form of a capacitor 62 with high isolation resistance. The capacitor 66 holds the peak true rms value for a limited time. The output of the capacitor 66 is buffered at a buffer circuit 64 and fed to the digital panel meter 40, see also FIG. 2 and thus is shown on the display 46.

Figure 4:
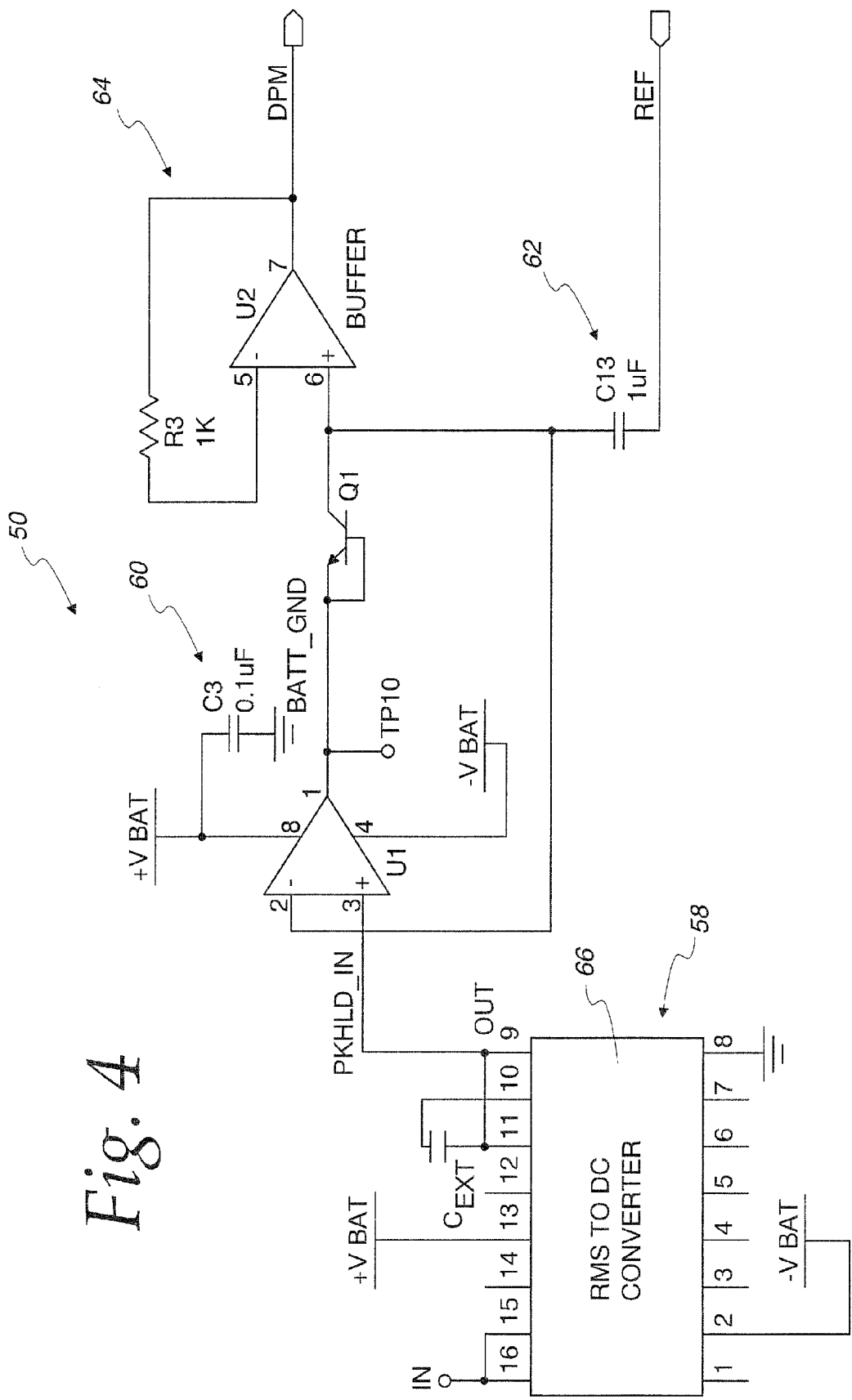
FIG. 4 is an electrical schematic of a peak hold circuit and related circuitry of the high voltage phasing voltmeter.

Referring to FIG. 4, an electrical schematic illustrates circuitry for the blocks 58, 60 and 64 of FIG. 3. The true rms converter 58 comprises an rms to DC converter 66 such as an LH0091 true rms to DC converter integrated circuit. The converter 66 receives the filtered AC voltage signal at a terminal IN. The converter 66 is powered by a battery in the housing 36 represented by the terminals +VBat and −VBat. The converter 66 develops a DC output at a terminal OUT comprising a DC output equal to the true rms value of the input at the terminal IN. Particularly, the converter 66 provides true rms conversion.

The DC signal corresponding to true rms voltage is connected to the positive input terminal of an operational amplifier U1. The operational amplifier U1 is also powered by the battery. The output of the operational amplifier U1 is connected to a transistor Q1 configured as a transistor switch which forms a precision rectifier circuit. Particularly, the base and emitter of the transistor Q1 are both connected to the output of the operational amplifier U1. The collector of the transistor Q1 is connected to the positive input terminal of a second operational amplifier U2 of the buffer circuit 64. The capacitor 62 is connected between the transistor Q1 and the second operational amplifier U2. The capacitor 62 is also connected to the negative input terminal of the first operational amplifier U1. The output of the second operational amplifier U2 is connected via a resistor R3 to the negative input terminal of the second operational amplifier U2. The output of the second operational amplifier U2 provides the signal to the digital panel meter 46, see FIG. 2. As described, the capacitor 62 holds the peak value of the true rms value from the converter 66. The output is buffered using the second operational amplifier U2 and fed to the DC panel meter 46.

The voltmeter 10 can be used for measuring voltages of overhead lines, such as shown in FIG. 1, or underground distribution lines, or the like. The meter 24 holds the true rms voltage of the line on the display 46 even after removing the probes 20 and 22 from contact with the conductors. This design requires few and low cost components and is simple in design. Moreover, the accuracy of the peak hold system improves as there is no quantization error due to analog to digital conversion.

The meter 24 includes the selector button switch 44 which can be used to selectively enable the peak hold circuitry. This is indicated by illumination of the indicator 42. Alternatively, the meter 24 can display actual measured voltage without use of the peak hold circuitry, as will be apparent.

While the voltmeter 10 is described in connection with probes for making electrical contact with the mode terminals, the peak hold circuitry could be used with connectionless phasing volt meters and remote display of high voltage measurement and testing.

Although a few embodiments have been described in detail above, other modifications are possible. For example, the logic flows depicted in the figures do not require the particular order shown, or sequential order, to achieve desirable results. Other steps may be provided, or steps may be eliminated, from the described flows, and other components may be added to, or removed from, the described systems. Other embodiments may be within the scope of the following claims.

The invention claimed is:

1. A high voltage phasing voltmeter comprising:
    first and second probes, each comprising an electrode for contacting a high voltage electrical conductor, the electrode being connected in series with a resistor; and
    a meter comprising a housing enclosing a peak hold selector switch and an electrical circuit for measuring true rms voltage, the electrical circuit comprising an input circuit for connection to the first and second probes and developing a scaled voltage representing measured voltage across the electrodes, a converter circuit for converting the scaled voltage to a DC signal representing true rms value of the measured voltage, a peak hold circuit connected to the converter circuit to hold a peak value of the true rms value and a display connected to the peak hold circuit for displaying the measured voltage and selectively displaying the peak value of the true rms value when the peak hold selector switch is enabled.

2. The high voltage phasing voltmeter of claim 1 wherein the input circuit comprises a filter circuit.

3. The high voltage phasing voltmeter of claim 1 wherein the converter circuit converts an ac input signal to a dc output signal.

4. The high voltage phasing voltmeter of claim 1 wherein the housing is integral with a handheld shield for one of the probes.

5. The high voltage phasing voltmeter of claim 4 further comprising a cable electrically connected between the electrical circuit and the other of the probes.

6. The high voltage phasing voltmeter of claim 1 wherein the electrical circuit comprises a battery powered circuit.

7. A high voltage phasing voltmeter comprising:
    first and second probes, each comprising an electrode for contacting a high voltage electrical conductor, the electrode being connected in series with a resistor; and
    a meter comprising a housing enclosing an electrical circuit for measuring true rms voltage, the electrical circuit comprising an input circuit for connection to the first and second probes and developing a scaled voltage representing measured voltage across the electrodes, a converter circuit for converting the scaled voltage to a DC signal representing true rms value of the measured voltage, a peak hold element connected to the converter circuit to hold a peak value of the true rms value and a display connected to the peak hold element for displaying the peak value of the true rms value, wherein a rectifier circuit has an input connected to the converter circuit and having an output connected to the peak hold element comprising a capacitor to hold the peak value of the true rms value.

8. The high voltage phasing voltmeter of claim 7 wherein the capacitor is connected by a buffer to the display.

9. The high voltage phasing voltmeter of claim 7 wherein the rectifier circuit comprises an operational amplifier connected to a transistor switch.

10. The high voltage phasing voltmeter of claim 7 wherein the capacitor has high isolation resistance.

11. A high voltage portable phasing voltmeter comprising:
    a first probe comprising an elongate insulated shield, an electrode extending from a distal end of the shield for contacting a high voltage electrical conductor, and a resistor in the shield connected in series with the electrode;
    a second probe comprising an elongate insulated shield, an electrode extending from a distal end of the shield for contacting a high voltage electrical conductor, and a resistor in the shield connected in series with the electrode; and
    a meter comprising a housing enclosing a peak hold selector switch and an electrical circuit for measuring true rms voltage, the electrical circuit comprising an input circuit for connection to the first and second probe resistors and developing a scaled voltage representing measured voltage across the electrodes, a converter circuit for converting the scaled voltage to a DC signal representing true rms value of the measured voltage, a peak hold circuit connected to the converter circuit to hold a peak value of the true rms value and a display connected to the peak hold circuit for displaying the measured voltage and selectively displaying the peak value of the true rms value when the peak hold selector switch is enabled.

12. The high voltage portable phasing voltmeter of claim 11 wherein the input circuit comprises a filter circuit.

13. The high voltage portable phasing voltmeter of claim 11 wherein the converter circuit converts an ac input signal to a dc output signal.

14. The high voltage portable phasing voltmeter of claim 11 wherein the housing is integral a handheld shield for one of the probes.

15. The high voltage portable phasing voltmeter of claim 14 further comprising a cable electrically connected between the electrical circuit and the other of the probes.

16. The high voltage portable phasing voltmeter of claim 11 wherein the electrical circuit comprises a battery powered circuit.

17. A high voltage portable phasing voltmeter comprising:
    a first probe comprising an elongate insulated shield, an electrode extending from a distal end of the shield for contacting a high voltage electrical conductor, and a resistor in the shield connected in series with the electrode;
    a second probe comprising an elongate insulated shield, an electrode extending from a distal end of the shield for contacting a high voltage electrical conductor, and a resistor in the shield connected in series with the electrode; and
    a meter comprising a housing enclosing an electrical circuit for measuring true rms voltage, the electrical circuit comprising an input circuit for connection to the first and second probe resistors and developing a scaled voltage representing measured voltage across the electrodes, a converter circuit for converting the scaled voltage to a DC signal representing true rms value of the measured voltage, a peak hold element connected to the converter circuit to hold a peak value of the true rms value and a display connected to the peak hold element for displaying the peak value of the true RMS value, wherein a rectifier circuit has an input connected to the converter circuit and having an output connected to the peak hold element comprising a capacitor to hold the peak value of the true rms value.

18. The high voltage portable phasing voltmeter of claim 17 wherein the capacitor is connected by a buffer to the display.

19. The high voltage portable phasing voltmeter of claim 17 wherein the rectifier circuit comprises an operational amplifier connected to a transistor switch.

20. The high voltage portable phasing voltmeter of claim 17 wherein the capacitor has high isolation resistance.

\* \* \* \* \*